(12) United States Patent
Miyada et al.

(10) Patent No.: US 6,777,775 B2
(45) Date of Patent: Aug. 17, 2004

(54) SEMICONDUCTOR INTEGRATED CIRCUIT, D-A CONVERTER DEVICE, AND A-D CONVERTER DEVICE

(75) Inventors: Yoshinori Miyada, Kyoto (JP); Kenji Murata, Osaka (JP); Daisuke Nomasaki, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/187,378

(22) Filed: Jul. 2, 2002

(65) Prior Publication Data

US 2003/0006481 A1 Jan. 9, 2003

(30) Foreign Application Priority Data

Jul. 4, 2001  (JP) ........................................ 2001-203216

(51) Int. Cl.[7] .............................................. H01L 29/00
(52) U.S. Cl. ...................................................... 257/532
(58) Field of Search ................................ 257/328, 329, 257/330, 331, 332, 333, 334, 533, 534, 528, 532; 438/238, 239, 240, 241

(56) References Cited

U.S. PATENT DOCUMENTS

| | | | |
|---|---|---|---|
| 5,138,467 A | * | 8/1992 | Saika et al. ................. 358/482 |
| 5,995,033 A | * | 11/1999 | Roeckner et al. ........... 341/155 |
| 6,369,853 B1 | * | 4/2002 | Merrill et al. .............. 348/302 |
| 6,492,221 B1 | * | 12/2002 | Hofmann et al. ........... 438/238 |

FOREIGN PATENT DOCUMENTS

| | | |
|---|---|---|
| JP | 11-68033 A | 7/1989 |
| JP | 1-248641 | 10/1989 |
| JP | 01248841 A | 10/1989 |
| JP | 02140958 A | 5/1990 |
| JP | 02140958 | 5/1990 |
| JP | 3-120848 | 5/1991 |
| JP | 03285333 A | 12/1991 |
| JP | 3-285333 | 12/1991 |
| JP | 05-047943 | 2/1993 |
| JP | 05047943 A | 2/1993 |
| JP | 05-235266 | 9/1993 |
| JP | 05235266 A | 9/1993 |
| JP | 10303373 | 11/1996 |
| JP | 2693928 | 9/1997 |
| JP | 10-303373 | 11/1998 |
| JP | 11068033 A | * 3/1999 |
| JP | 20010203216 | 6/2003 |

* cited by examiner

Primary Examiner—Long Pham
Assistant Examiner—Dana Farahani
(74) Attorney, Agent, or Firm—McDermott Will & Emery LLP

(57) ABSTRACT

A semiconductor integrated circuit has a plurality of capacitor cells, and each capacitor cell has an upper electrode and a lower electrode. These electrodes are respectively connected to an upper electrode wiring and a lower electrode. When, for example, the upper electrode is connected to the upper electrode wiring and the electrode wiring is located at a side of the lower electrode of another capacitor cell or a side of the lower electrode wiring connecting these electrodes, a shield wiring is provided between the upper electrode wiring and the adjacently-located lower electrode of the other capacitor cell or between the upper electrode wiring and the adjacently-located lower electrode wiring. Thus, with this shield wiring, the capacitance coupling between each wiring of the capacitor cells and each upper electrode or each lower electrode of the capacitor cells are effectively suppressed.

33 Claims, 12 Drawing Sheets

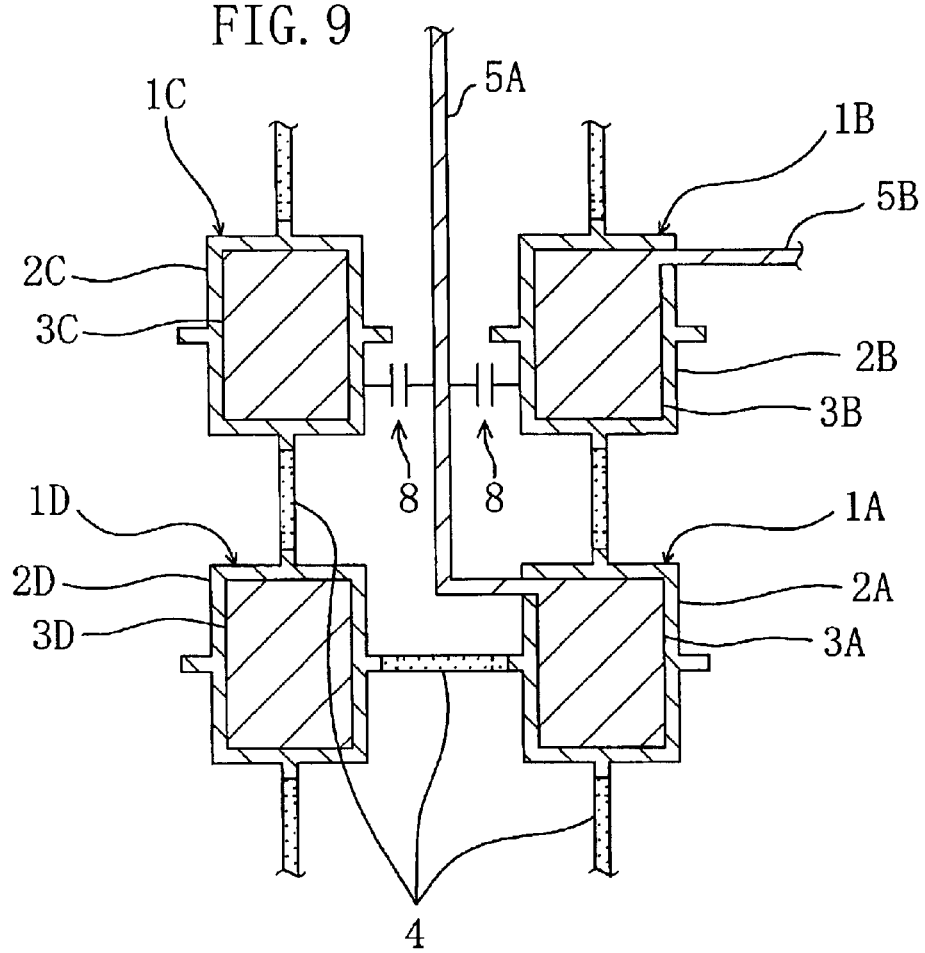
FIG. 9
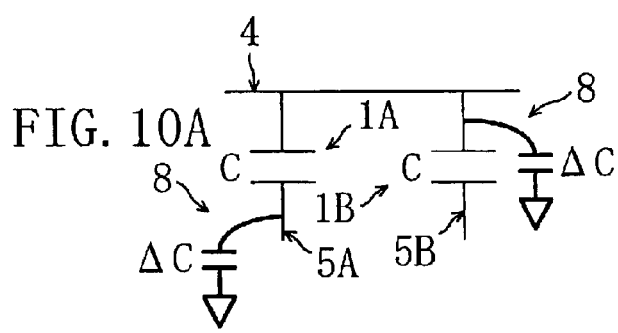
FIG. 10A
FIG. 10B

SEMICONDUCTOR INTEGRATED CIRCUIT, D-A CONVERTER DEVICE, AND A-D CONVERTER DEVICE

BACKGROUND OF THE INVENTION

The present invention relates to a semiconductor integrated circuit (LSI) as well as a D-A converter device and an A-D converter device, and more particularly, to a technique for increasing the relative accuracy between a plurality of capacitances in an LSI chip.

Generally, when a plurality of capacitor cells are formed in a semiconductor integrated circuit, the relative accuracy is determined by the degree of uniformity of the insulating layer between two electrodes that forms each capacitor cell, and in addition, the degree of uniformity of parasitic capacitances formed by the wirings by which the electrodes are connected to another circuit element. In order to avoid variations due to the shapes of devices, n unit capacitor cells are connected in parallel when a capacitance that is n times (n is an integer) that of a unit capacitance C is required.

In addition, when a desired capacitance is obtained by combining unit capacitor cells in a capacitor array, the unit capacitor cells are selected from the capacitor array in a distributive manner, taking into variations between the unit capacitor cells in the capacitor array. For example, assuming that capacitors having a capacitance ratio of C1:C2:C3= 1:1:2 are required, a unit capacitor cell 100A and a unit capacitor cell 100B are respectively assigned for the capacitance C1 and the capacitance C2 and two unit capacitor cells 100C and 100D are assigned for the capacitance C3.

In this case, a lower electrode wiring 300 is connected in common to all the lower electrodes 200A to 200D of the unit capacitor cells 100A to 100D, and is arranged along the peripheral edge of the capacitor array. An upper electrode wiring 500A connected to an upper electrode 400A of the unit capacitor cell 100A is arranged along the lower electrode wiring 300, whereas an upper electrode wiring 500C for the unit capacitor cells 100C and 100D is arranged to pass through the vicinity of the unit capacitor cells 100A to 100D. With this arrangement, parasitic capacitances 600 are apt to be produced particularly by the upper electrode wirings 500A and 500C. In order to avoid these, it is necessary to ensure wide spaces between the capacitor cells 100A to 100D.

If the spaces between the capacitor cells 100A to 100D are widened, however, capacitance value variations between the capacitor cells 100A to 100D increase in the capacitor array, resulting in degradation in the relative accuracy of the capacitances between the capacitor cells 100A to 100D. Moreover, the area of the capacitor array as a whole increases, leading to an increase in chip cost.

The following discusses how much area is required for a capacitor array in a case of a 10-bit charge distribution type D-A converter that has a capacitor array composed of a plurality of unit capacitor cells. It should be noted that in the following discussion, the capacitor array is as follows. Four unit capacitor cells are disposed in a 2×2 arrangement, and each unit cell has a pair of electrodes formed by interposing an insulating layer (relative dielectric constant: 4) between a conductive layer (thickness: 1 $\mu$m) and a conductive layer dedicated to a capacitor electrode, and is a square in which each side is 14 $\mu$m. The capacitance density is 1 fF/$\mu$m² (unit capacitance: 196 fF). The wirings have a wire width of 0.5 $\mu$m and are formed in the conductive layer.

In this case, the parasitic capacitance that is generated when a wiring is disposed between unit capacitor cells at a certain distance L (unit: $\mu$m) from each of the unit capacitor cell is calculated using opposing area capacitance conversion approximately as follows:

$$14 \times 1 \times (1/L) \times 4 \times 8.85 \, E^{-18} = 0.5 \, fF/L.$$

Meanwhile, it is necessary in this case that the relative accuracy of the capacitance of the most significant bit is less than 0.05% of the unit capacitance (196 fF).

Accordingly, in order to reduce the parasitic capacitance to less than 0.05% of the unit capacitance, it is necessary that the distance L between the unit capacitor cell and the wiring should be:

$$0.5 \, fF/L < 196 \, fF \times 0.0005,$$

and thus, $$L > 5.1 \, \mu m.$$

In this case, the area required by this capacitor array needs to be:

$$(14 \times 2 + 5.1 \times 2 + 0.5)^2 = 38.7^2 = 1497.69,$$

and thus, it is understood that this capacitor array requires approximately twice the area of the case in which four unit capacitor cells are merely arranged without providing spaces therebetween (28×28=784).

In addition, when two wirings are disposed between unit capacitor cells and the spaces for these wirings are also need to be spaced apart in a similar manner, the spaces between unit capacitor cells is 16.3 $\mu$m. Under this condition, if the capacitor array has 36 unit capacitor cells that are arrayed in a 6×6 arrangement, the area of the capacitor array as a whole becomes approximately four times the area that is effectively used as capacitors.

As described above, the prior art has at least the drawbacks as follows. When parasitic capacitances due to wiring are taken into consideration in order to avoid degradation in relative accuracy of the capacitances of capacitor cells, a large space between capacitor cells is necessitated, which consequently degrades the relative accuracy of the capacitances between the plurality of capacitor cells. Moreover, a larger device area is necessitated, which leads to an increase in chip cost.

SUMMARY OF THE INVENTION

Accordingly, it is an object of the present invention to reduce, in a semiconductor integrated circuit in which a plurality of circuit elements such as capacitor cells on a semiconductor substrate are connected to wirings, parasitic capacitances between the circuit elements, between the wirings, and between the wirings and the elements without increasing the spaces between the circuit elements, and thereby increase relative accuracy of the capacitances between the circuit elements without causing an increase in chip cost due to an increase in the area.

In order to accomplish this and other objects, a shield wiring is provided according to the present invention between a wiring and another wiring, or between a wiring and a circuit element, to suppress parasitic capacitance using the shield wiring.

Specifically, the present invention provides a semiconductor integrated circuit comprising a first wiring and a second wiring disposed adjacent to one another; and a shield wiring provided so as to suppress a capacitance coupling between the first wiring and the second wiring.

Further, according to the present invention, the above-described semiconductor integrated circuit further may comprise a circuit element having a first electrode and a second electrode; the semiconductor integrated circuit wherein the first wiring is a first electrode wiring connected to the first electrode of the circuit element; the second wiring is a second electrode wiring connected to the second electrode of the circuit element; and the shield wiring is provided so as to suppress a capacitance coupling between the first electrode wiring and the second electrode and a capacitance coupling between the second electrode wiring and the first electrode, in addition to the capacitance coupling between the first electrode wiring and the second electrode wiring.

Accordingly, in the present invention, the capacitive coupling between the first wiring and the second wiring and the capacitive coupling between the wiring and the electrodes can be suppressed by the shield wiring. Therefore, the spaces between two wirings and the spaces between the wirings and the electrodes can be narrowed in comparison with the prior art, and thus the relative accuracy of the capacitances in circuit elements can be increased without increasing the size of the circuit as a whole.

In addition, according to the present invention, the above-described semiconductor integrated circuit may further comprise a plurality of capacitor cells disposed adjacent to one another, each of the capacitor cells having a first electrode and a second electrode; and in the above-described semiconductor integrated circuit: the first wiring may be a first electrode wiring connected to the first electrode of each of the capacitor cells; the second wiring may be a second electrode wiring connected to the second electrode of each of the capacitor cells; and the shield wiring may be provided so as to suppress a capacitance coupling between the first electrode wiring and the second electrode in addition to the capacitance coupling between the first electrode wiring and the second electrode wiring.

Accordingly, in the present invention, when in a plurality of capacitor cells, each of the first electrodes is an individual electrode to which an individual potential is supplied for each capacitor cell, it is possible to suppress both the capacitance coupling between the individual electrode wiring in each capacitor cell and the common electrode in other capacitor cells and the capacitance coupling between the individual electrode wiring of each capacitor cell and the common electrode wiring in other capacitor cells.

Further, in the semiconductor integrated circuit according to the present invention, the shield wiring may be provided so as to also suppress a capacitance coupling between the second electrode wiring and the first electrode.

Accordingly, in the present invention, when the first electrode and the second electrode are both individual electrodes in each capacitance cell in a plurality of capacitance cells, it is possible to suppress the capacitance coupling between the first electrode wiring and the second electrode wiring and the capacitance coupling between the first electrode wiring and the second electrode. Moreover, the capacitance coupling between the second electrode wiring and the first electrode can be suppressed.

BRIEF DESCRIPTION OF THE DRAWINGS

FIG. 9 is a diagram that corresponds to FIG. 8 and schematically shows the configuration of a unit capacitor cell in which a shield wiring is not provided.

FIGS. 10A and 10B are equivalent circuit diagrams, in which FIG. 10A shows a case that a shield wiring is provided and FIG. 10B shows a case that a shield wiring is not provided.

DETAILED DESCRIPTION OF THE INVENTION

Preferred embodiments of the present invention are detailed below with reference to the attached drawings.
Embodiment 1

Figure 1:
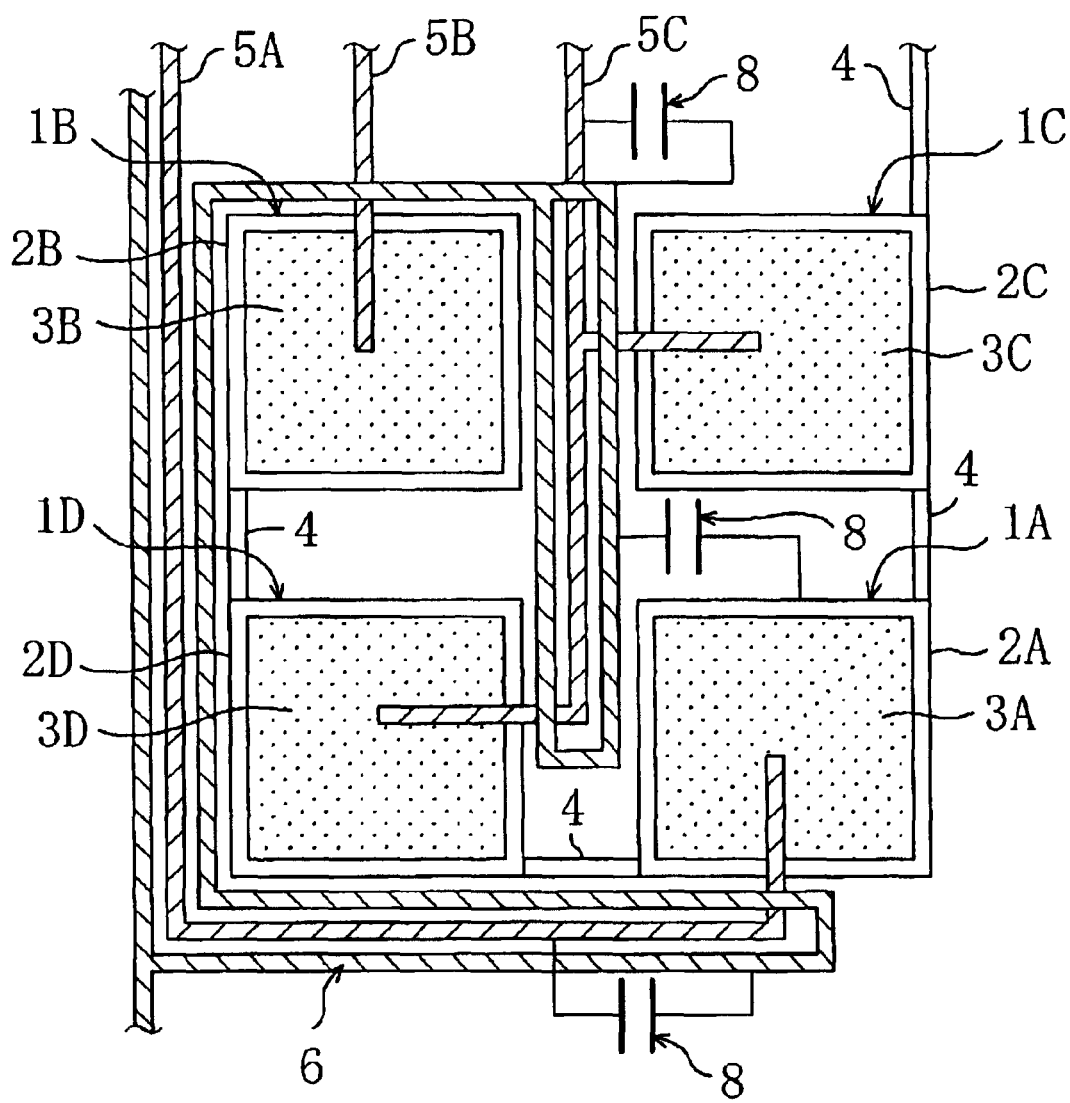
FIG. 1 is a plan view schematically showing the configuration of a capacitor array according to Embodiment 1 of the present invention.

FIG. 1 schematically shows the configuration of a capacitor array according to Embodiment 1 of the present invention. As will be described later, this capacitor array is used in, for example, a charge redistribution type D-A converter, serving as a local D-A converter of a charge redistribution type A-D converter device.

The capacitor array of FIG. 1 is composed such that four unit capacitor cells 1A to 1D are disposed in a 2×2 arrangement, and the following illustrates an example in which, of these unit capacitor cells 1A to 1D, the unit capacitor cells 1A and 1B are independently used whereas the remaining unit capacitor cells IC and ID form one capacitor cell. The capacitance ratio C1:C2:C3 of these capacitor cells 1A, 1B, and (1C and ID) is C1:C2:C3=1:1:2.

The unit capacitor cells 1A to 1D each have a substantially square shape and have lower electrodes 2A to 2D and upper electrodes 3A to 3D, respectively. The lower electrodes 2A to 2D are connected to a lower electrode wiring 4, which is common to the unit capacitor cells 1A to 1D. The lower electrode wiring 4 is disposed in the periphery of the capacitor array so that it extends from the upward direction to the downward direction of FIG. 1, is first connected to the lower electrode 2C, and is then connected successively to the remaining lower electrodes 2A, 2D, and 2B.

Meanwhile, the upper electrode 3A of the unit capacitor cell 1A is connected to an upper electrode wiring 5A. The upper electrode wiring 5A extends from the upward direction to the downward direction of FIG. 1 and is disposed along the left side and the bottom side (in the figure) of the capacitor array. The upper electrode 3B of the unit capacitor cell 1B is connected to an upper electrode wiring 5B. The upper electrode wiring 5B is disposed so that it extends from the upward direction to the downward direction of the figure and reaches the upper electrode 3B. The upper electrodes 3C and 3D of the remaining unit capacitor cells 1C and 1D are connected in common to an upper electrode wiring 5C. This upper electrode wiring 5C is disposed so that it extends from the upward direction to the downward direction of the figure and pass through the center of the capacitor array.

According to the present embodiment, a shield wiring 6 is provided at both sides of the upper electrode wiring 5A for the unit capacitor cell 1A in the capacitor array region. The shield wiring 6 is provided such that it surrounds a large portion of the common upper electrode wiring 5C for the unit capacitor cells 1C and 1D on two sides. Thus, the lower electrodes 2B and 2D of the unit capacitor cells 1B and 1D, and the lower electrode wiring 4 are positioned at one side of the shield wiring 6, whereas the upper electrode wiring 5A is positioned at the other side thereof. Therefore, the capacitance couplings are suppressed between the upper electrode wiring 5A and the lower electrodes 2B and 2D of the unit capacitor cells 1B and 1D and between the upper electrode wiring 5A and the lower electrode wiring 4. Likewise, the lower electrodes 2A to 2D of the unit capacitor cells 1A to 1D are positioned at one side of the shield wiring 6, whereas the upper electrode wiring 5C is positioned at the other side. Therefore, the capacitance coupling is suppressed between the upper electrode wiring 5C and the lower electrodes 2A to 2D of the unit capacitor cells 1A to 1D.

It should be noted that, although the provision of the shield wiring 6 produces additional parasitic capacitances 8 between the shield wiring 6 and the upper electrode wirings 5A and 5C, these parasitic capacitances 8 are not so large as to affect the relative accuracy of the capacitances between the unit capacitor cells 1A to 1D.

Thus, according to the present embodiment, both the capacitance coupling between the upper electrode wiring 5A and the lower electrode wiring 4, and the capacitance coupling between the upper electrode wiring 5A and the lower electrodes 2B and 2D can be effectively suppressed without increasing the spaces between the unit capacitor cells 1A to 1D. In addition, the capacitance coupling between the upper electrode wiring 5C and the lower electrodes 2A to 2D can be effectively suppressed. Therefore, the relative accuracy between the unit capacitor cells 1A to 1D can be increased without causing an increase in chip cost.

Embodiment 2

Figure 2:
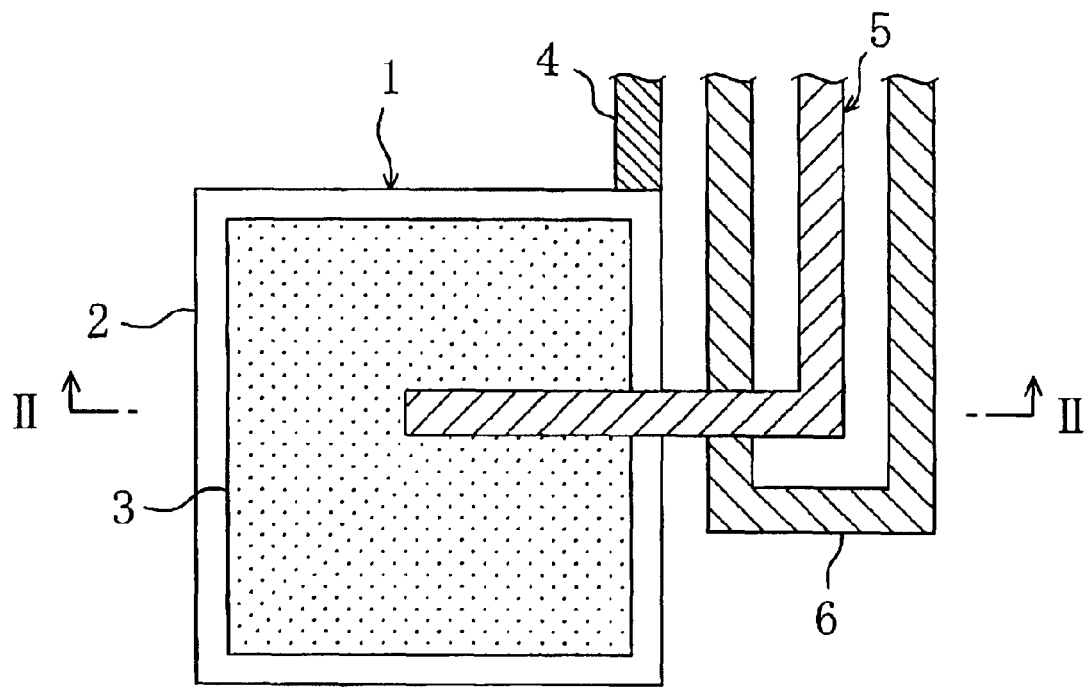
FIG. 2 is a plan view schematically showing the configuration of a unit capacitor cell according to Embodiment 2 of the present invention.
Figure 3:
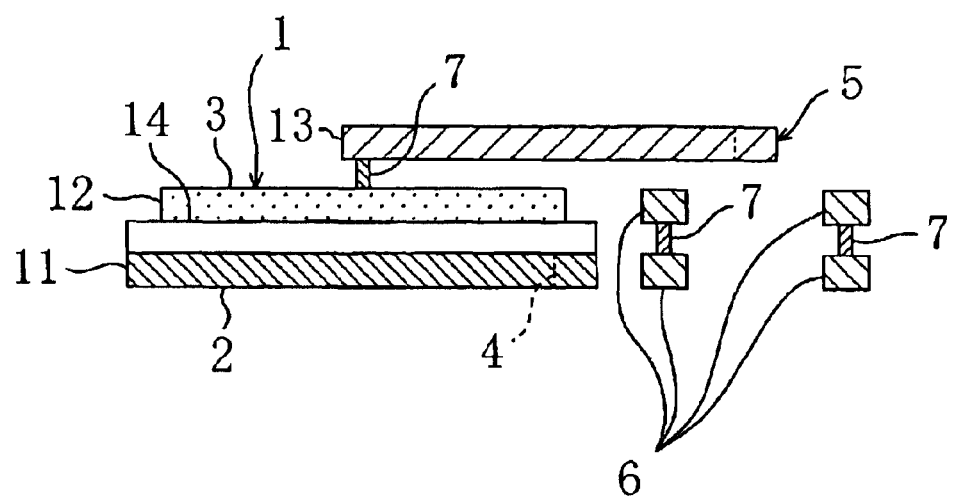
FIG. 3 is a cross-sectional view taken along the line II—II of FIG. 2.

FIGS. 2 and 3 schematically show the configuration of a unit capacitor cell according to Embodiment 2 of the present invention.

In the present embodiment, a first conductive layer 11, a second conductive layer 12 that is located above the first conductive layer 11 shown in the figure, and the third conductive layer 13 above the second conductive layer 12 are provided on a substrate (not shown). A capacitor cell 1 has a lower electrode 2 formed in the first conductive layer 11, and an upper electrode 3 formed in the second conductive layer 12 so as to oppose the lower electrode 2 with an insulating layer 14 interposed therebetween. The lower electrode 2 is connected to a lower electrode wiring 4, and the lower electrode wiring 4 is formed in the first conductive layer 11. Meanwhile, the upper electrode 3 is connected to an upper electrode wiring 5 via a conductive member 7, and the upper electrode wiring 5 is formed in the third conductive layer 13.

According to the present embodiment, a shield wiring 6 formed in the first and second conductive layers 11 and 12 is disposed at the circumference of a large part of the upper electrode wiring 5. In the shield wiring 6, a portion formed with the first conductive layer 11 and a portion formed with the second conductive layer 12 are electrically connected to each other via the conductive member 7.

Thus, the present embodiment can also achieve similar advantageous effects to those obtained by Embodiment 1. It should be noted here that, although the shield wiring 6 is formed with the first and the second conductive layers 11 and 12 in the present invention, it is of course possible to form the shield wiring 6 only in the second conductive layer 12.

Embodiment 3

Figure 4:
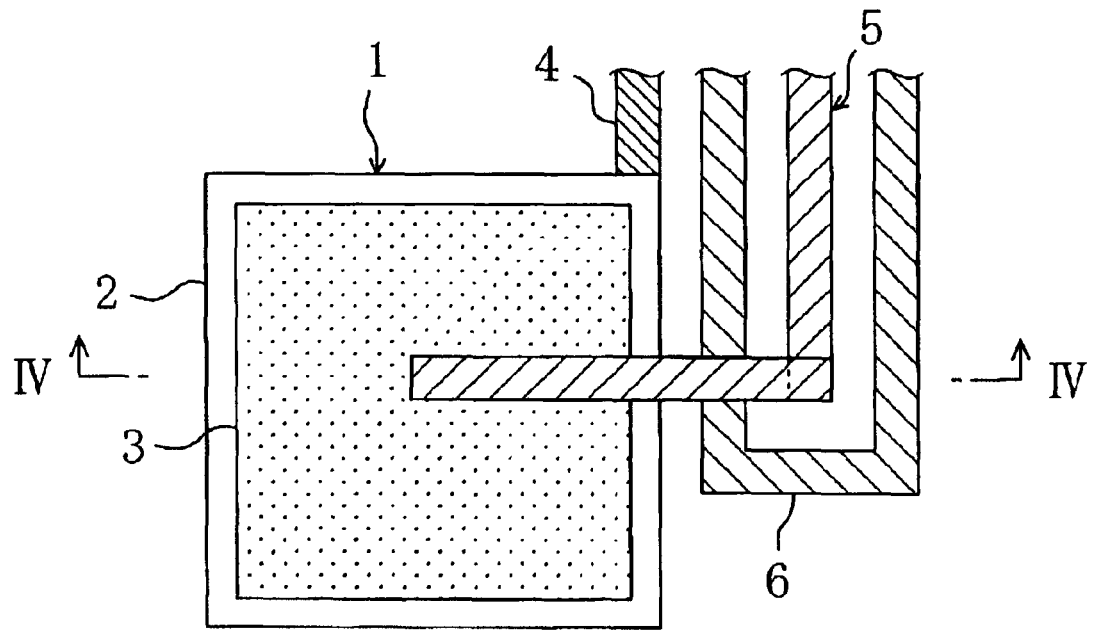
FIG. 4 is a plan view schematically showing the configuration of a unit capacitor cell according to Embodiment 3 of the present invention.
Figure 5:
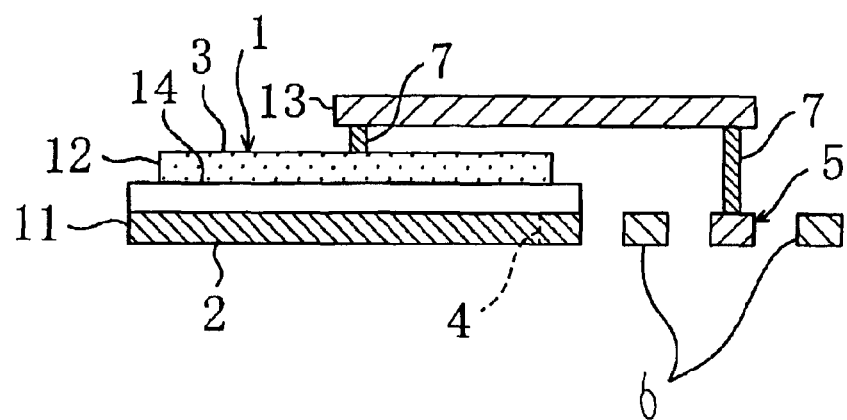
FIG. 5 is a cross-sectional view taken along the line IV—IV of FIG. 4.

FIGS. 4 and 5 schematically show the configuration of a unit capacitor cell according to Embodiment 3 of the present invention. It should be noted that similar parts to those of the foregoing embodiment 2 are designated by the same reference characters and are not further elaborated on.

In the present embodiment, the capacitor cell 1 has a lower electrode 2 formed in the first conductive layer 11 and an upper electrode 3 formed in the second conductive layer 12 so as to oppose the lower electrode 2 with an insulating layer 14 interposed therebetween, as in the case of Embodiment 2. The lower electrode 2 is connected to an lower electrode wiring 4 that is formed in the first conductive layer 11. The upper electrode 3 is connected to an upper electrode wiring 5, and the connecting portion of the upper electrode wiring 5 with the upper electrode 3 is formed using the third conductive layer 13. The present embodiment differs from the foregoing embodiment 2 in that the upper electrode wiring 5 is formed in the first conductive layer 11, not in the third conductive layer 13. It should be noted that the upper electrode wiring 5 is connected to the third conductive layer 13 via a conductive member 7.

In the present embodiment, the upper electrode wiring 5 is surrounded by a shield wiring 6 formed in the first conductive layer 11, and with this configuration, both the capacitance coupling between the upper electrode wiring 5 and the lower electrode wiring 4 and the capacitance coupling between the upper electrode wiring 5 and the upper and lower electrodes 2 and 3 are suppressed.

Hence, the present embodiment can also achieve similar advantages and effects to those obtained by Embodiment 2.

Embodiment 4

Figure 6:
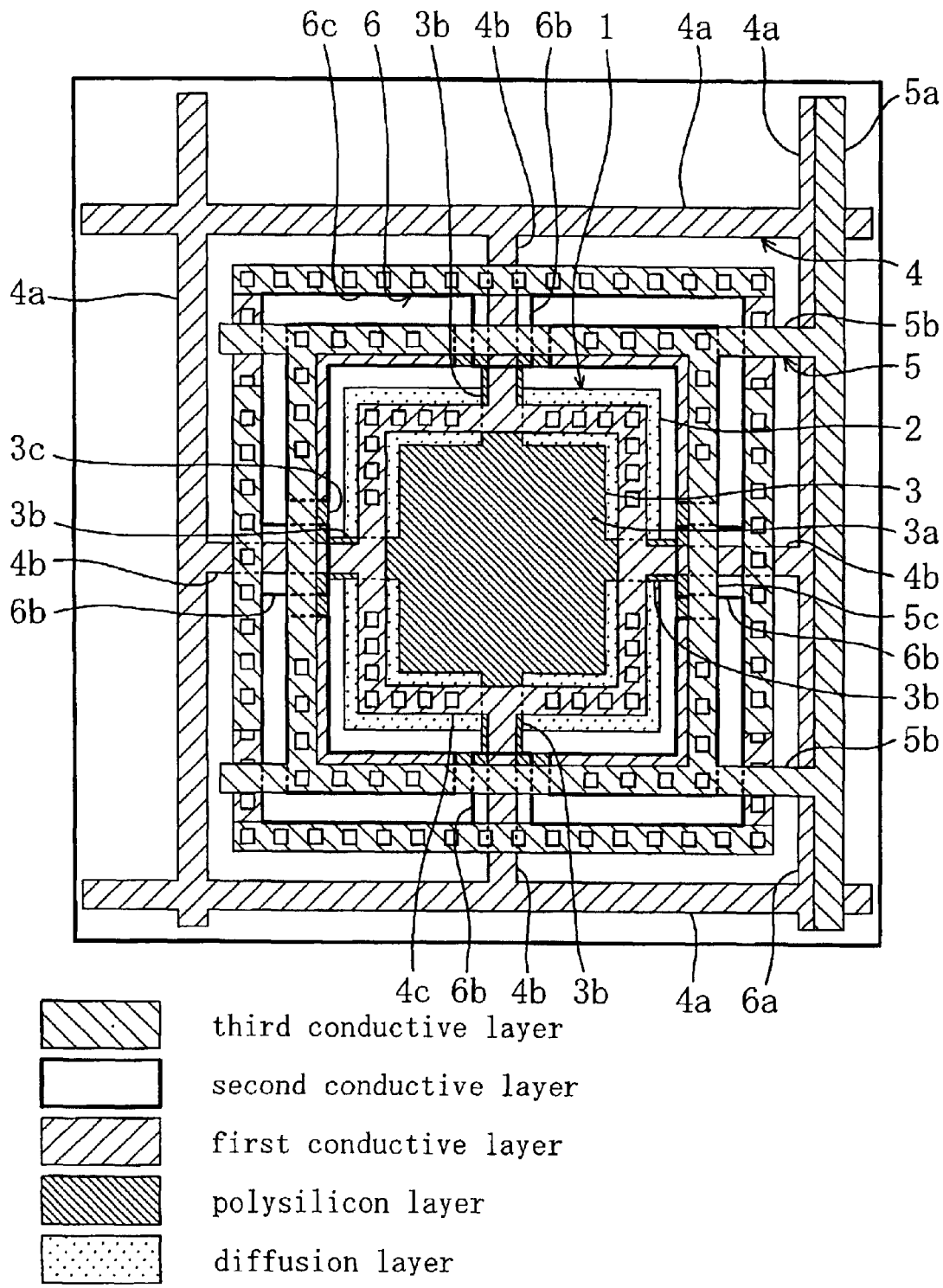
FIG. 6 is a plan view schematically showing the configuration of a unit capacitor cell according to Embodiment 4 of the present invention.

FIG. 6 schematically show the configuration of a unit capacitor cell according to Embodiment 4 of the present invention.

In the present embodiment, the unit capacitor is composed of a capacitance between a diffusion layer (bottommost layer) 2 and a polysilicon layer 3, which is a layer thereabove, and a unit capacitor cell 1 is formed including various portions of wirings and the polysilicon layer 3, which affects the accuracy of capacitance of the unit capacitor.

Specifically, the diffusion layer 2 forms a substantially rectangular shape. A diffusion layer electrode wiring 4 for the diffusion layer 2 is composed of first portions 4a extending between adjacent unit capacitor cells 1 along the vertical direction and the lateral direction, second portions 4b extending from four first portions 4a that are adjacent to the corresponding adjacent unit capacitor cells 1 toward the midpoints of respective sides of the diffusion layer 2, and a rectangular frame-shaped third portion 4c arranged so as to overlap with the peripheral portion of the diffusion layer 2. The first portions 4a of the diffusion layer electrode wiring 4 are formed in the first conductive layer, which is a layer above the polysilicon layer 3, and the second portions 4b and the third portions 4c are also formed in the first conductive layer.

On the other hand, the polysilicon layer 3 is disposed inside the inner periphery of the third portion 4c of the diffusion layer electrode wiring 4, and it is composed of a substantially rectangular-shaped first portion 3a overlapping the center portion of the diffusion layer 2, four second portions 3b extending radially from the midpoints of respective sides of the first portion 3a, and a substantially rectangular-shaped third portion 3c disposed outside the outer periphery of the diffusion layer 2 so as to surround the diffusion layer 2. This diffusion layer 3 forms the peripheral edge of the region of the unit capacitor cell 1. A polysilicon layer electrode wiring 5 is connected to the polysilicon layer 3 and is composed of a first portion 5a disposed overlapping the vertical one of the first portions 4a of the diffusion layer electrode wiring 4, two second portions 5b extending in a lateral direction from the first portion 5a toward two corner portions of the third portion 3c of the polysilicon layer 3, and a substantially rectangular-shaped third portion 5c disposed overlapping the third portion 3c of the polysilicon layer 3.

All the first to third portions 5a to 5c of the polysilicon layer electrode wiring 5 are formed in a third conductive layer (topmost layer), and the third portion 5c is connected to the third portion 3c of the polysilicon layer 3 via the first conductive layer and a second conductive layer, which is a layer thereabove. It should be noted that the layers adjacent to each other across the layer thickness are electrically insulated by an insulating layer, which is not shown in the figure. It also should be noted that white squares shown in FIG. 6 represent conductive members (vias) interposed between corresponding layers.

In the present embodiment, a shield wiring 6 is provided in the second conductive layer. The shield wiring 6 of the second conductive layer is positioned between the diffusion layer electrode wiring 4 disposed in the first conductive layer and the electrode wiring 5 disposed in the third conductive layer to suppress the capacitive coupling between these wirings 4 and 5. The shield wiring 6 is fixed at the ground potential, though not shown in the figure.

Specifically, the shield wiring 6 has a first portion 6a and a second portion 6b. The first portion 6a covers the first portions 4a of the diffusion layer electrode wiring 4 that extend in the vertical and lateral directions, and is also positioned below the first portion 5a of the polysilicon layer electrode wiring 5. The second portion 6b covers the second portion 4b of the diffusion layer electrode wiring 4. These first and second portions 6a and 6b are formed in the second conductive layer. The shield wiring 6 also has a rectangular frame-shaped third portion 6c formed in an inner peripheral edge portion thereof (i.e., in a portion positioned between the four first portions 4a and the third portion 5c of the polysilicon layer electrode wiring 5) that is in the third conductive layer (partially in the first conductive layer), and is grounded through the third portion 6c.

Figure 7:
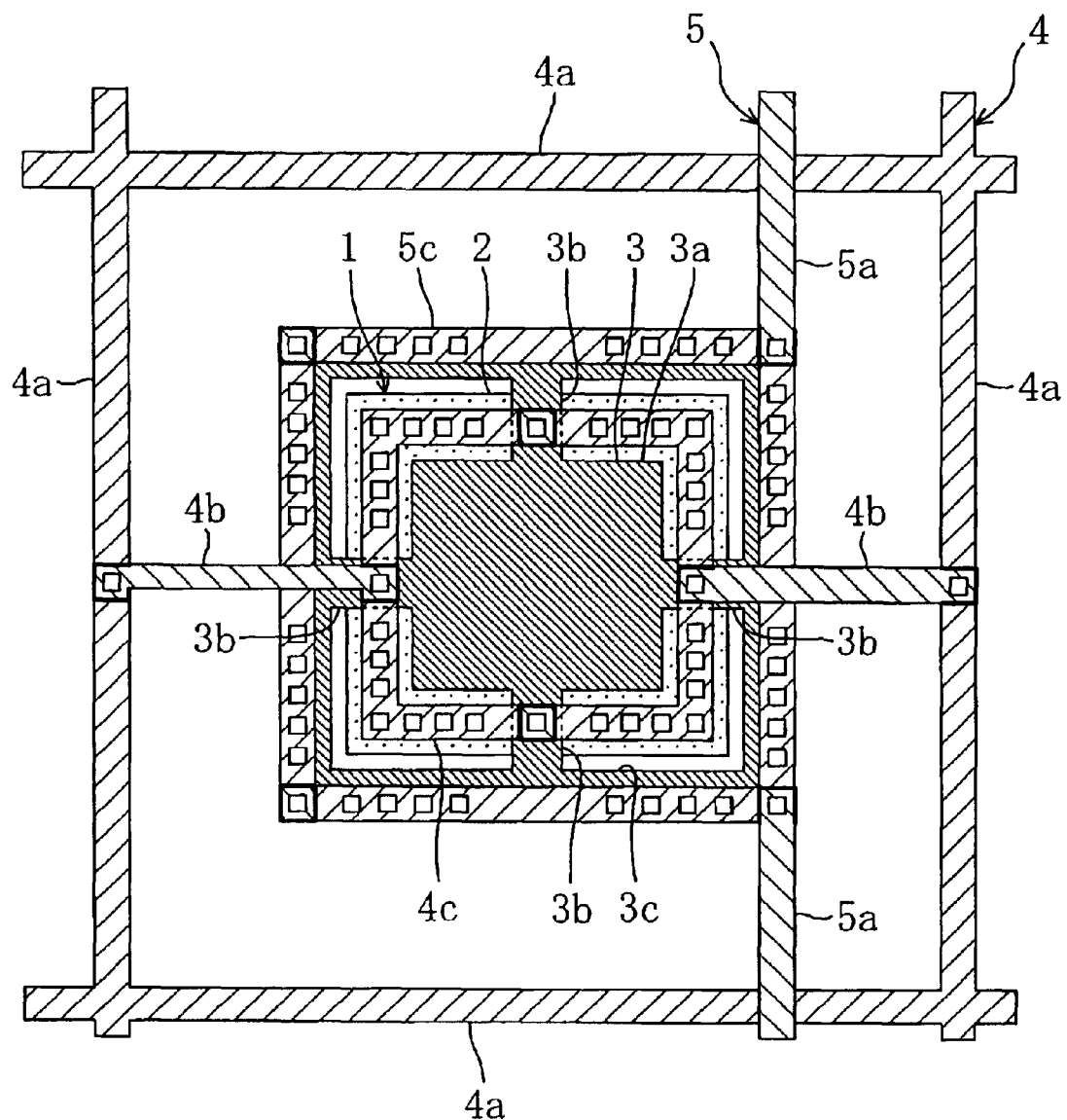
FIG. 7 is a diagram that corresponds to FIG. 6 and schematically shows the configuration of a unit capacitor cell in which a shield wiring is not provided.

For comparison, FIG. 7 shows a conventional unit capacitor cell in which parasitic capacitance coupling is suppressed without providing a shield wiring. In the figure, the conductive layers that form the diffusion layer electrode wiring 4 and those portions of polysilicon layer electrode wiring 5 are slightly different from that of the present embodiment, but the positional arrangement thereof is approximately the same as the present embodiment. As is clearly understood from the comparison between FIG. 6 and FIG. 7, by providing a shield wiring 6, the present embodiment can achieve a reduction in spaces between the unit capacitor cell 1 and each first portion 4a of the diffusion layer electrode wiring 4.

Thus, according to the present invention, though the polysilicon layer 3 is a region that affects the relative accuracy of the capacitance of the unit capacitor cell 1, the unit capacitor cell 1 is formed including the third portion 3c of this polysilicon layer 3 and the third portion Sc of the polysilicon layer electrode wiring 5, and in a region outward of this unit capacitor cell 1, the diffusion layer electrode wiring 4 is disposed in the first conductive layer while the polysilicon layer electrode wiring 5 is disposed in the third conductive layer; the shield wiring 6 is then provided in the second conductive layer so that it is overlapped with these wirings 4 and 5 with respect to the top-to-bottom direction. Therefore, with this shield wiring 6, the capacitance coupling between these wirings 4 and 5 can be reduced. As a result, the capacitances of the unit capacitor cells 1 are ensured to be approximately the desired capacitances, so the relative accuracy between adjacent unit capacitor cells 1 can be improved. Furthermore, since it is unnecessary to make the space between the diffusion layer 4 and the polysilicon layer electrode wiring 5, an increase in the device area does not occur.

Embodiment 5

Figure 8:
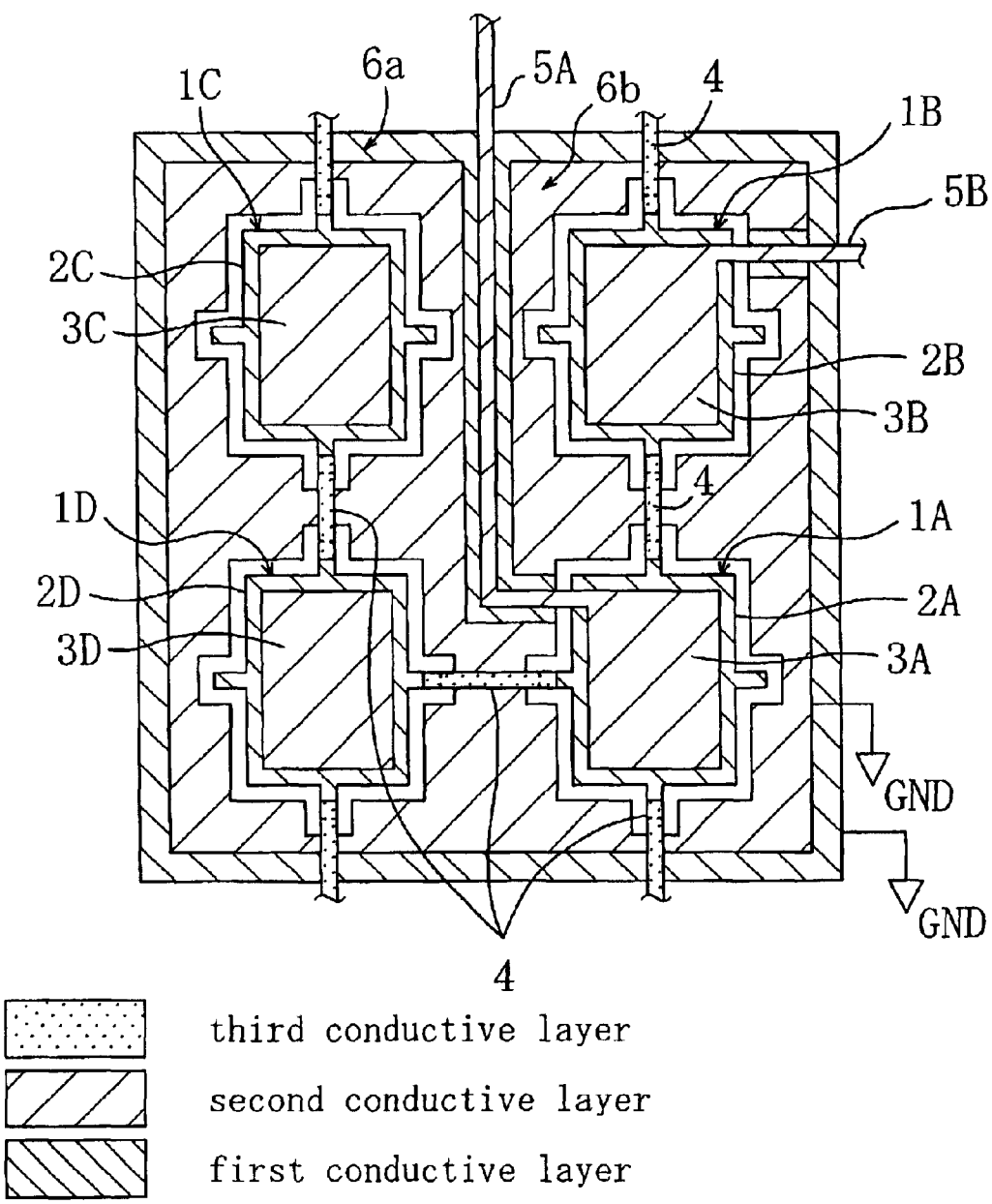
FIG. 8 is a plan view schematically showing the configuration of a capacitor array according to Embodiment 5 of the present invention.

FIG. 8 schematically shows the configuration of a capacitor array according to Embodiment 5 of the present invention. It should be noted that similar parts to those of the foregoing embodiment 1 are designated by the same reference characters.

This capacitor array has four unit capacitor cells 1A to 1D disposed in a 2×2 arrangement. The unit capacitor cells 1A to 1D each have a substantially rectangle shape and have lower electrodes 2A to 2D and upper electrodes 3A to 3D, respectively. The lower electrodes 2A to 2D are formed in a first conductive layer, whereas the upper electrodes 3A to 3D are formed in a second conductive layer, which is a layer above the first conductive layer. The lower electrode 2A to 2D of the respective unit capacitor cells 1A to 1D are connected to a lower electrode wiring 4, which is common to the unit capacitor cells 1A to 1D. The lower electrode wiring 4 is formed in the third conductive layer, which is a layer above the second conductive layer. Meanwhile, the upper electrode 3A of the unit capacitor cell 1A is connected to an upper electrode wiring 5A. The upper electrode wiring 5A is formed in the second conductive layer. The upper electrode 3A is connected to an upper electrode wiring 5B. The upper electrode wiring 5B is formed in the second conductive layer, as in the case of the upper electrode wiring 5A.

In the present embodiment, a shield wiring 6a that is formed in the first conductive layer, and a shield wiring 6b that is formed in the second conductive layer are provided. These shield wirings 6a and 6b are formed in regions of the first and the second conductive layers except the portions that form the lower electrodes 2A to 2D and the upper electrodes 3A to 3D of the unit capacitor cells 1A to 1D, the upper electrode wirings 5A and 5B, and the lower electrode wiring 4. Consequently, the shield wirings 6a and 6b serve the function of suppressing the capacitance coupling of the upper electrode wiring 5A with the lower electrodes 2B to 2D and the upper electrodes 3B to 3D of the unit capacitor cells 1B to 1D, which are not connected to the upper electrode wiring 5A, as well as the capacitance coupling between the upper electrode wiring 5A and the lower electrode wiring 4.

For comparison, FIG. 9 shows a semiconductor integrated circuit in which the shield wiring is not provided. In this semiconductor integrated circuit, as exemplified in FIG. 10B, the capacitance of the unit capacitor cell 1A increases by $\Delta C$ (C+$\Delta C$) due to a parasitic capacitance 8 generated between the upper electrode wiring 5A of the unit capacitor cell 1A and the lower electrode 2B of the unit capacitor cell 1B, degrading the relative accuracy of the charge holding capacitances. In contrast, according to the present embodiment, as is understood from FIG. 10A, the capacitance of the unit capacitor cell 1A does not vary, and therefore, the relative accuracy can be maintained.

Thus, the present embodiment also achieves similar advantages and effects to those attained by Embodiment 1.

Embodiment 6

Figure 11:
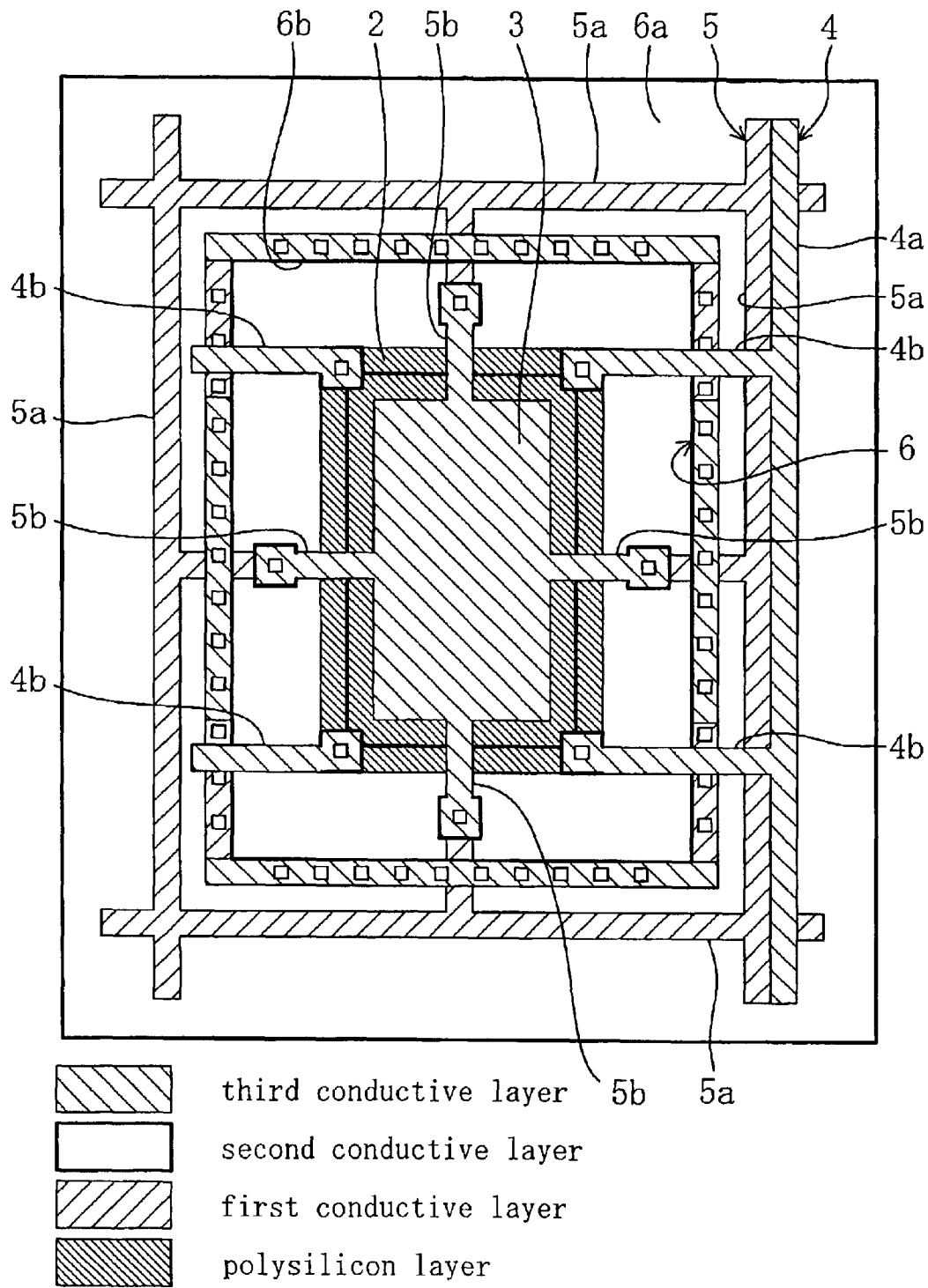
FIG. 11 is a plan view schematically showing the configuration of a unit capacitor cell according to Embodiment 6 of the present invention.

FIG. 11 schematically shows the configuration of a unit capacitor cell according to Embodiment 6 of the present invention.

This unit capacitor cell has a polysilicon layer, a first conductive layer, which is a layer above the polysilicon layer, a second conductive layer, which is a layer above the first conductive layer, and a third conductive layer, which is a layer above the second conductive layer. The polysilicon layer has a first electrode 2 formed therein, and the third conductive layer has a second electrode 3 formed therein.

A first electrode wiring 4 connected to the first electrode 2 is composed of first portions 4a disposed so as to extend between adjacent unit capacitor cells 1 in a vertical direction, and four second portions 4b extending from four respective corner portions of the first electrode 2 in lateral directions. These first and second portions 4a and 4b are both formed in the third conductive layer.

Meanwhile, a second electrode wiring 5 connected to the second electrode 3 is composed of first portions 5a disposed so as to extend between adjacent unit capacitor cells 1 in vertical and lateral directions, and four second portions 5b extending from four respective first portions 5a that are adjacent to the corresponding unit capacitor cells 1 toward the midpoints of respective sides of the second electrode 3. Each of the first portions 5a is formed in the first conductive layer. A portion of each second portion 5b that is near the first portion 5a is formed in the first conductive layer, whereas a portion of each second portion 5b that is near the second electrode 3 is formed in the third conductive layer, and both portions are connected to each other via the second conductive layer.

In the present embodiment, a shield wiring 6 is provided in the second conductive layer that is between the first conductive layer and the third conductive layer so as to suppress the capacitance coupling between the second electrode wiring 5 of the first conductive layer and the first electrode wiring 4 of the third conductive layer as well as the capacitance coupling between the second electrode wiring 5 of the first conductive layer and the second electrode 3 of the third conductive layer. The shield wiring 6 has a first portion 6a that is provided having a rectangular shape on the second conductive layer so as to overlap with the first portions 5a of the second electrode wiring 5 of the first conductive layer. The shield wiring 6 also has a rectangular frame-shaped second portion 6b in the periphery of an inner edge positioned inward of the four first portions 5a of the second electrode wiring 5 and outward of the second electrode 3.

Figure 12:
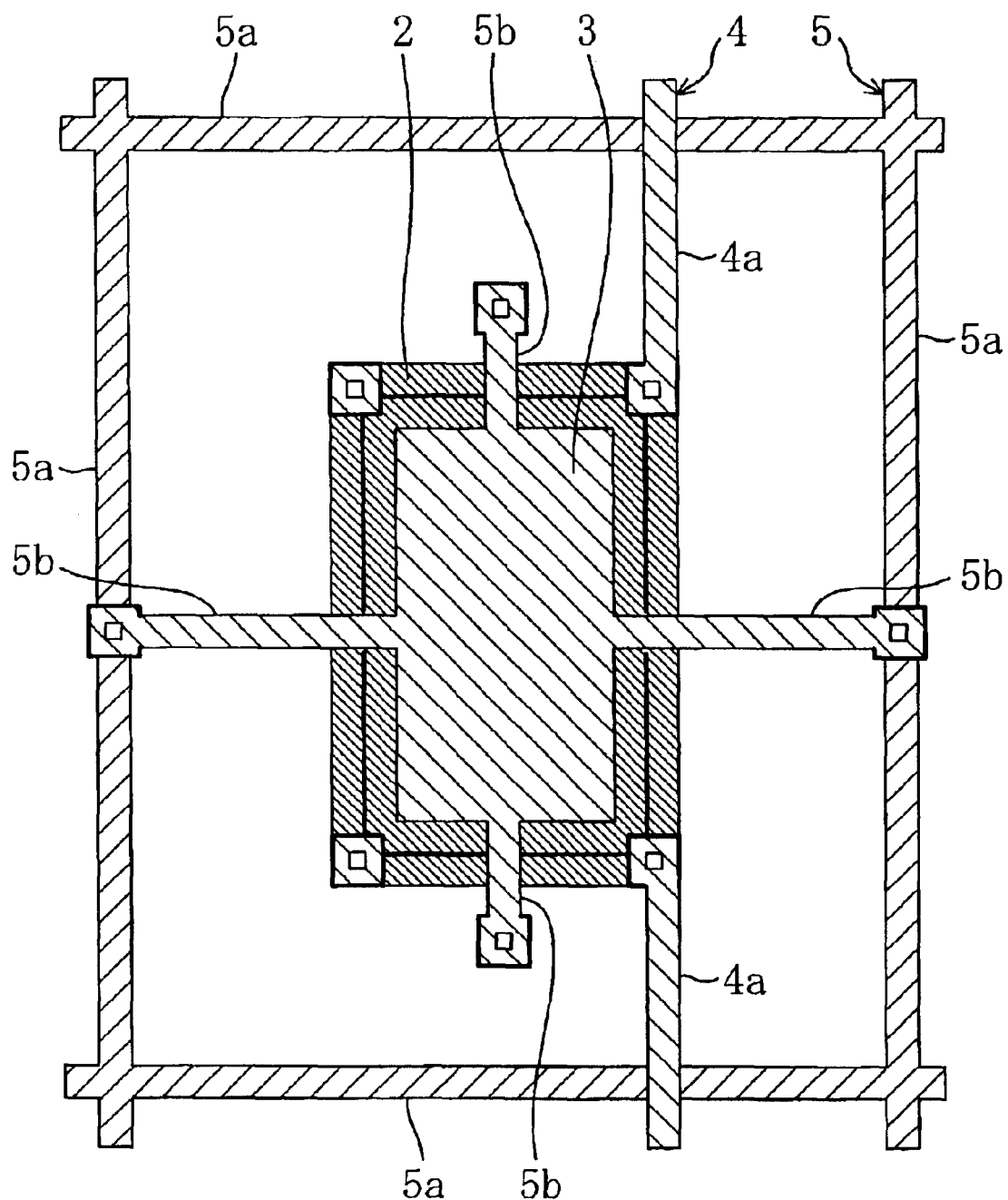
FIG. 12 is a diagram that corresponds to FIG. 11 and schematically shows the configuration of a unit capacitor cell in which a shield wiring is not provided.

For comparison, FIG. 12 shows a conventional unit capacitor cell in which parasitic capacitance coupling is suppressed without providing a shield wiring. In the figure, the conductive layers that form the portions of the first electrode wiring 4 and second electrode wiring 5 are slightly different from those of the present embodiment, but the arrangement thereof is approximately the same as that of the present embodiment. As is clearly understood from the comparison between FIG. 11 and FIG. 12, by providing a shield wiring 6, the present embodiment can achieve a reduction in spaces between the unit capacitor cell and each first portion 5a of the second electrode wiring 5.

Embodiment 7

Figure 13:
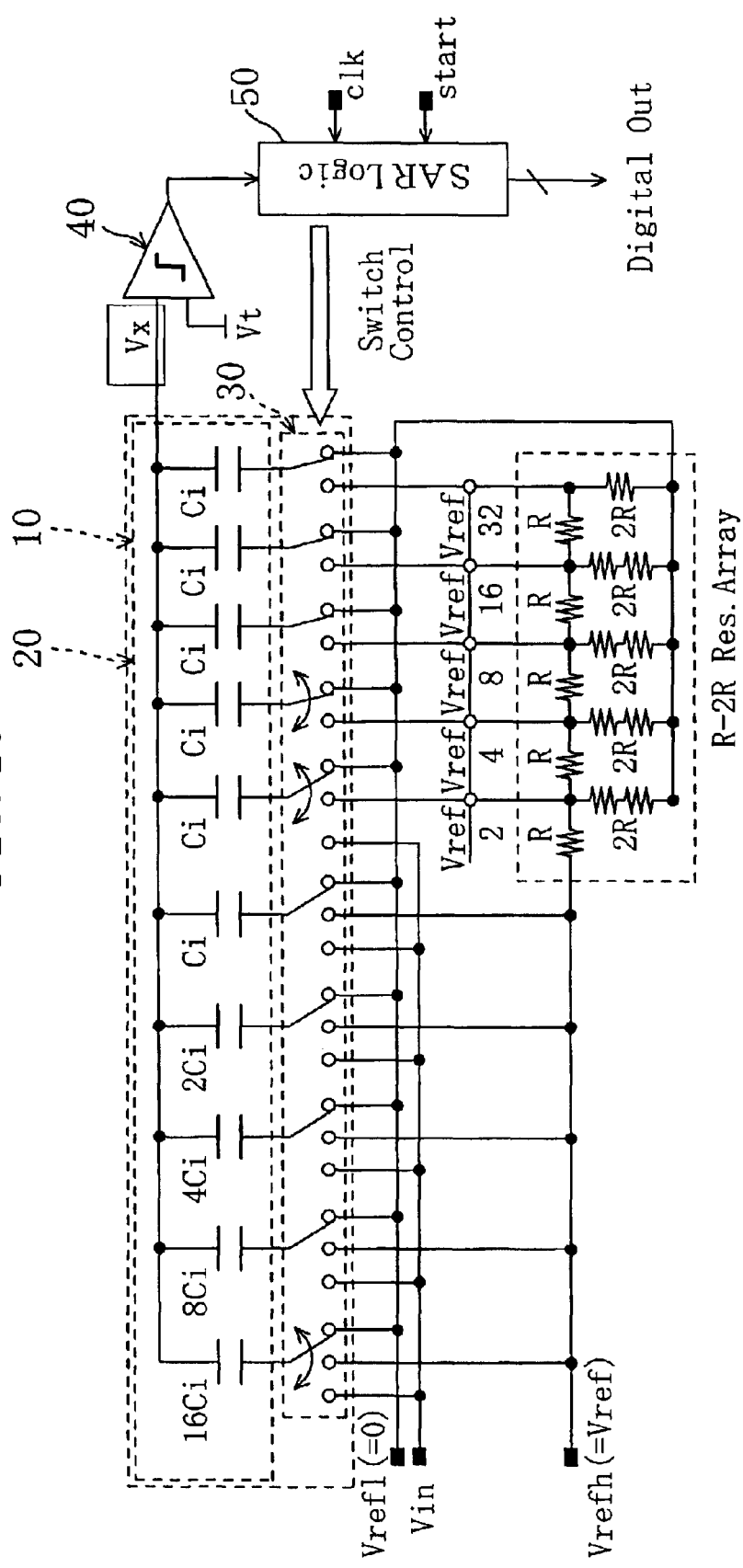
FIG. 13 is a circuit diagram showing the configuration of a 10-bit charge redistribution type A-D converter according to Embodiment 7 of the present invention.

FIG. 13 shows the configuration of a 10-bit charge redistribution type A-D converter device according to Embodiment 7 of the present invention. This A-D converter device incorporates a local D-A converter 10 that is a charge distribution type D-A converter that uses the capacitor array 20 according to Embodiment 4 (see FIG. 6).

The capacitor array 20 has 10 capacitors, the capacitance ratio of which is 16:8:4:2:1:1:1:1:1:1, and the D-A converter 10 has a switch group 30 composed of ten switches each provided for each of the capacitors. A comparator 40 compares an input analog signal Vin with the capacitance of the most significant bit under a condition in which the switch for the capacitor that corresponds to the most significant bit is switched to the Vrefh side while the switches for the rest of the capacitors are switched to the Vrefl side. Based on the result of the comparison performed by the comparator 40, a successive approximation register 50 fixes the switch to the Vrefh side to determine the bit value to be "1" when the capacitance of the most significant bit is larger, whereas the switch is switched to the Vrefl side to determine the bit value to be "0" when the capacitance of the most significant bit is smaller. This operation is successively carried out for each capacitor at each one clock to determine the bit value for each bit. Thus, the analog signal Vin is converted into a digital signal to be output.

The result of an experiment is discussed below regarding the integral linearity characteristics of the A-D converter device according to the present embodiment. In addition, for comparison, the integral linearity characteristics were also examined for a conventional example of an A-D converter apparatus that incorporates a D-A converter using the capacitor array without a shield wiring (see FIG. 7). The results are shown in FIG. 14.

Figure 14:
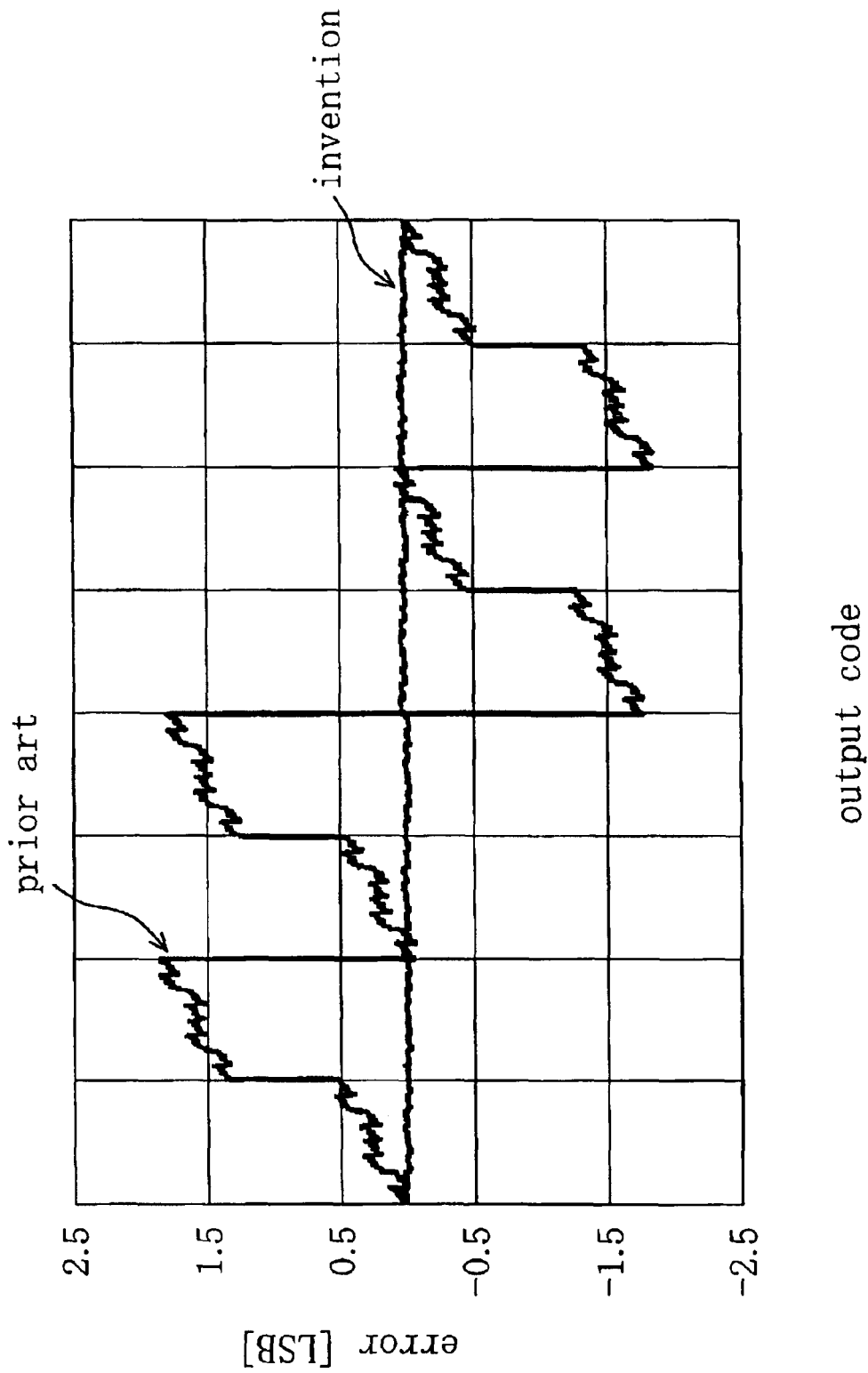
FIG. 14 shows the integral linearity characteristics of 10-bit charge redistribution type A-D converters, in which an example of the present invention and a conventional example are compared.
Figure 15:
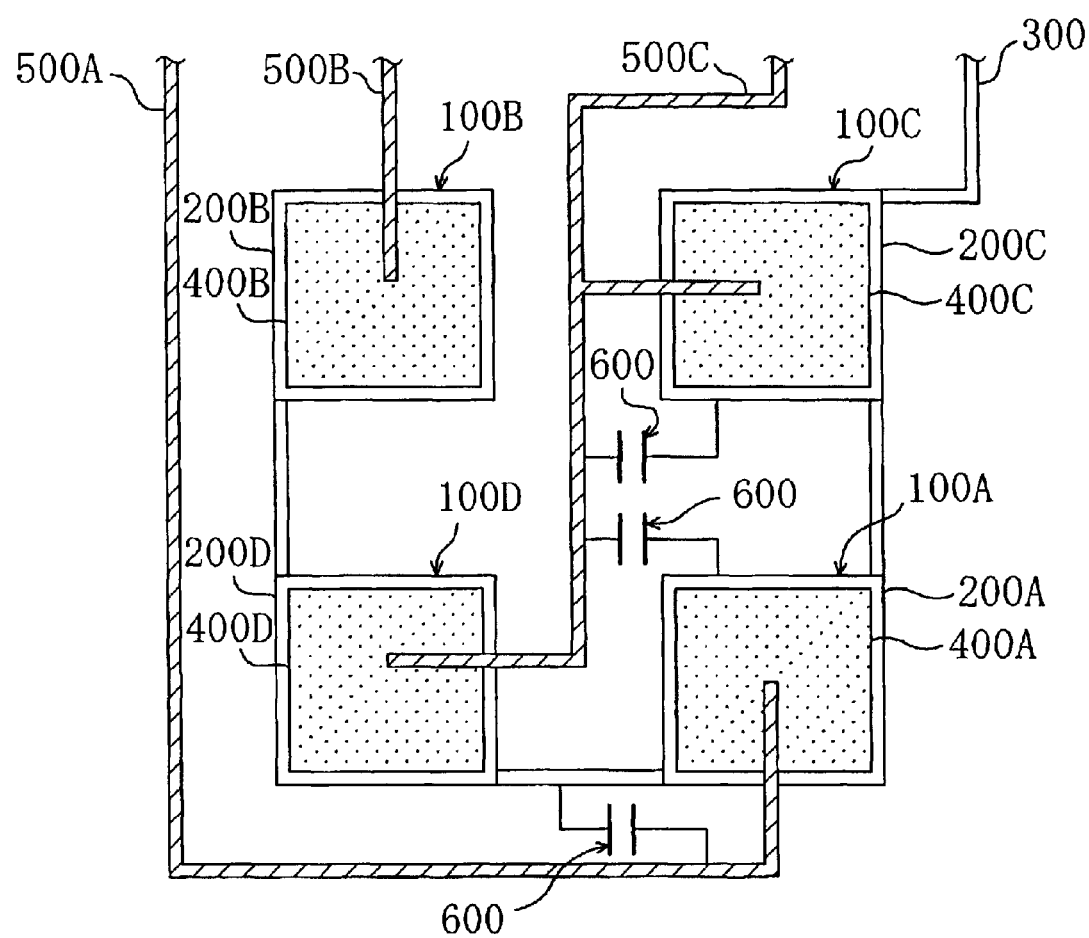
FIG. 15 is a plan view schematically showing the configuration of a conventional capacitor array.

It is understood from FIG. 14 that, whereas the conventional example shows an error of about ±1.7 LSB, the present embodiment can suppress the error to ±0.2 LSB or less.

Thus, according to the present embodiment, in a charge redistribution type A-D converter device which incorporates the charge distribution type D-A converter 10 as a local D-A converter, the capacitor array 20 according to Embodiment 4 is used for the charge distribution type D-A converter. Therefore, the relative accuracy of the capacitances of the unit capacitor cells in the capacitor array 20 can be increased while preventing an increase in the area of the capacitor array, and thus, the present embodiment contributes to an improvement in the accuracy of the charge distribution type D-A converter 10 and the charge redistribution type A-D converter device.

Although the present embodiment describes an example in which Embodiment 4 is applied to the capacitor array 20 of the charge distribution type D-A converter 10, it is possible to adopt Embodiments 1 to 3 and Embodiments 5 and 6.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor integrated circuit comprising:
   a capacitance element having a first and a second electrode;
   a first electrode wiring connected to the first electrode of the capacitance element; and
   a shield wiring provided so as to suppress a capacitance coupling between the first electrode wiring and the capacitance element.

2. The semiconductor integrated circuit according to claim 1, further comprising:
   a second electrode wiring connected to the second electrode of the capacitance element, wherein
   the shield wiring is provided so as to suppress a capacitance coupling between the first electrode wiring and the second electrode wiring in addition to the capacitance coupling between the first electrode wiring and the second electrode.

3. A semiconductor integrated circuit comprising:
   a plurality of capacitor cells disposed adjacent to one another, each of the capacitor cells having a first electrode and a second electrode;
   a first electrode wiring connected to the first electrode each of the capacitor cells;
   a second electrode wiring connected to the second electrode of each of the capacitor cells; and
   a shield wiring is provided so as to suppress a capacitance coupling between the first electrode wiring and a capacitor cell of said plurality of capacitor cells in addition to a capacitance coupling between the first electrode wiring and the second electrode wiring.

4. The semiconductor integrated circuit according to claim 3, wherein the shield wiring is provided so as to suppress a capacitance coupling between the second electrode wiring and the first electrode.

5. The semiconductor integrated circuit according to claim 3, wherein: the first electrode wiring, the second electrode wiring, and the first electrode are formed in a same conductive layer; and the shield wiring is formed in the same conductive layer.

6. The semiconductor integrated circuit according to claim 3, wherein the shield wiring is set at a predetermined fixed potential.

7. The semiconductor integrated circuit according to claim 6, wherein the fixed potential of the shield wiring is substantially a mean potential of voltages applied to the capacitor cells.

8. The semiconductor integrated circuit according to claim 3, wherein, one of the first electrode and the second electrode of each capacitor cell is formed in a diffusion layer.

9. The semiconductor integrated circuit according to claim 3, further comprising:
   a first conductive layer,
   a second conductive layer provided above the first conductive layer, and
   a third conductive layer provided above the second conductive layer;
   wherein: the first electrode of each of the capacitor cells is formed by electrically connecting the first conductive layer and the third conductive layer, and the first electrode of each of the capacitor cells is formed in the second conductive layer.

10. A charge distribution type digital-to-analog converter device comprising the semiconductor integrated circuit according to claim 3.

11. A charge redistribution type analog-to-digital converter device comprising a local digital-to-analog converter device that is the charge distribution type digital-to-analog converter device according to claim 10.

12. The semiconductor integrated circuit according to claim 1, wherein at least a part of the shield wiring is located between the first electrode wiring and the second electrode.

13. The semiconductor integrated circuit according to claim 12, wherein the capacitance element is a capacitor cell.

14. A charge distribution type digital-to-analog converter device comprising the semiconductor integrated circuit according to claim 13.

15. A charge distribution type analog-to-digital converter device comprising a local digital-to-analog converter device that is a charge distribution type digital-to-analog converter device according to claim 14.

16. The semiconductor integrated circuit according to claim 2,
   wherein at least a part of the shield wiring is located between the first electrode wiring and the second electrode, and at least a part of the shield wiring is located between the first electrode wiring and the second electrode wiring.

17. The semiconductor integrated circuit according to claim 16, wherein the capacitance element is a capacitor cell.

18. A charge distribution type digital-to-analog converter device comprising the semiconductor integrated circuit according to claim 17.

19. A charge distribution type analog-to-digital converter device comprising a local digital-to-analog converter device that is a charge distribution type digital-to-analog converter device according to claim 18.

20. The semiconductor integrated circuit according to claim 3, wherein each of the plurality of capacitor cells have a capacitance which is substantially the same.

21. The semiconductor integrated circuit according to claim 3, wherein the plurality of capacitor cells are contained in an array.

22. A semiconductor integrated circuit comprising:
   a capacitance element having a first and second electrode;
   a first electrode wiring connected to the first electrode of the capacitance element; and,
   a shield region provided so as to suppress a capacitance coupling between the first electrode wiring and the capacitance element.

23. The semiconductor integrated circuit according to claim 22, further comprising:
   a second electrode wiring connected to the second electrode of the capacitance element, wherein
   the shield region is provided so as to suppress a capacitance coupling between the first electrode wiring and the second electrode wiring in addition to the capacitance coupling between the first electrode wiring and the second electrode.

24. A semiconductor integrated circuit comprising:
   a plurality of capacitor cells disposed adjacent to one another, each of the capacitor cells having a first electrode and a second electrode;

a first electrode wiring connected to the first electrode of each of the capacitor cells;

a second electrode wiring connected to the second electrode of each of the capacitor cells; and a shield region provided so as to suppress a capacitance coupling between the first electrode wiring and a capacitor cell of said plurality of capacitor cells in addition to a capacitance coupling between the first electrode wiring and the second electrode wiring.

25. The semiconductor integrated circuit according to claim 24, wherein the shield region is set at a predetermined fixed potential.

26. The semiconductor integrated circuit according to claim 24, further comprising:

a first conductive layer, a second conductive layer provided above the first conductive layer, and a third conductive layer provided above the second conductive layer;

wherein: the first electrode wiring of each of the capacitor cells is formed in the first conductive layer; the second electrode wiring of eachof the capacitor cells is formed in the third conductive layer; and the shield region is formed in the second conductive layer.

27. The semiconductor integrated circuit according to claim 22, wherein the capacitance element is a capacitor cell.

28. The semiconductor integrated circuit according to claim 24, further comprising:

a first conductive layer, a second conductive layer provided above the first conductive layer, and a third conductive layer provided above the second conductive layer;

wherein: the first electrode of each of the capacitor cells is formed by electrically connecting the first conductive layer and the third conductive layer; and the first electrode of each of the capacitor cells is formed in the second conductive layer.

29. A charge distribution type digital-to-analog converter device comprising the semiconductor integrated circuit according to claim 24.

30. The semiconductor integrated circuit according to claim 24, wherein, one of the first electrode and the second electrode of each capacitor cell is formed in a diffusion layer.

31. A The semiconductor integrated circuit according to claim 24, wherein each of the plurality of capacitor cells has substantially the same capacitance.

32. The semiconductor integrated circuit according to claim 24, wherein the plurality of capacitor cells is contained in an array.

33. The semiconductor integrated circuit according to claim 26, wherein at least a part of the shield region is located between the first conductive layer and the third conductive layer.

* * * * *

UNITED STATES PATENT AND TRADEMARK OFFICE
CERTIFICATE OF CORRECTION

PATENT NO. : 6,777,775 B2
DATED : August 17, 2004
INVENTOR(S) : Yoshinori Miyada et al.

It is certified that error appears in the above-identified patent and that said Letters Patent is hereby corrected as shown below:

Title page,
Item [56], References Cited, U.S. PATENT DOCUMENTS, add
-- 5,045,915    09/1991        Hinooka --
FOREIGN PATENT DOCUMENTS, remove:
"JP    01248841 A    10/1989
 JP    02140958      05/1990
 JP    03285333 A    12/1991
 JP    05047943 A    02/1993
 JP    05235266 A    09/1993
 JP    10303373      11/1996"

Signed and Sealed this

Fifteenth Day of February, 2005

JON W. DUDAS
*Director of the United States Patent and Trademark Office*

UNITED STATES PATENT AND TRADEMARK OFFICE
CERTIFICATE OF CORRECTION

PATENT NO. : 6,777,775 B2
DATED : August 17, 2004
INVENTOR(S) : Yoshinori Miyada et al.

It is certified that error appears in the above-identified patent and that said Letters Patent is hereby corrected as shown below:

Title page,
Item [56], References Cited, U.S. PATENT DOCUMENTS, add
-- 5,045,915    9/1991  Hinooka --
FOREIGN PATENT DOCUMENTS, remove:
* JP 01248841 A 10/1989
  JP 02140958   05/1990
  JP 03285333 A 12/1991
  JP 05047943 A 02/1993
  JP 05235266 A 09/1993
  JP 10303373   11/1996 *

Signed and Sealed this

Twenty-second Day of February, 2005

JON W. DUDAS
*Director of the United States Patent and Trademark Office*